United States Patent [19]
Fuke et al.

[11] Patent Number: 6,062,795
[45] Date of Patent: *May 16, 2000

[54] WAFER RING FEEDING APPARATUS

[75] Inventors: Shigeru Fuke, Musashino; Tsuneharu Arai, Fussa; Eiji Kikuchi, Musashimurayama, all of Japan

[73] Assignee: Kabushiki Kaisha Shinkawa, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/940,427

[22] Filed: Sep. 30, 1997

[30] Foreign Application Priority Data

Oct. 1, 1996 [JP] Japan .................................. 8-280307

[51] Int. Cl.⁷ .................................................. B65G 49/07
[52] U.S. Cl. ...................... 414/331.16; 414/417; 414/936
[58] Field of Search ........................ 414/331.14, 331.16, 414/331.17, 417, 750, 811, 936, 935; 198/735.3

[56] References Cited

U.S. PATENT DOCUMENTS

| 4,457,662 | 7/1984 | Ireland et al. ..................... 414/331.16 |
| 4,674,238 | 6/1987 | Suzuki et al. ..................... 198/735.3 X |
| 4,712,963 | 12/1987 | Kondo ................................. 414/417 X |
| 4,958,722 | 9/1990 | Kobayahsi et al. ................. 198/735.3 |
| 5,520,276 | 5/1996 | Aoki et al. ........................ 198/735.3 X |
| 5,562,382 | 10/1996 | Miyoshi ............................. 414/750 X |
| 5,824,185 | 10/1998 | Nakamura et al. ................. 414/941 X |
| 5,827,035 | 10/1998 | Fuke et al. ............................ 414/417 |
| 5,848,868 | 12/1998 | Suzuki et al. ...................... 414/936 X |
| 5,853,532 | 12/1998 | Nakamura et al. ................. 414/935 X |

FOREIGN PATENT DOCUMENTS

| 3540476 | 5/1987 | Germany ............................. 414/417 |
| 217436 | 9/1986 | Japan ................................... 414/417 |
| S62-106642 | 5/1987 | Japan . |
| 5235146 | 9/1993 | Japan ................................... 414/935 |
| 5338730 | 12/1993 | Japan ................................... 414/937 |

*Primary Examiner*—James W. Keenan
*Attorney, Agent, or Firm*—Koda & Androlia

[57] ABSTRACT

A device for preventing wafer rings from being caught on a pair of guide rails of a wafer ring conveying apparatus, including an open-and-close mechanism which moves the pair of guide rails in a closing direction when a wafer ring is supplied onto the guide rails from the wafer ring cassette so as to correct the rotational orientation and/or offset of the wafer ring.

2 Claims, 5 Drawing Sheets

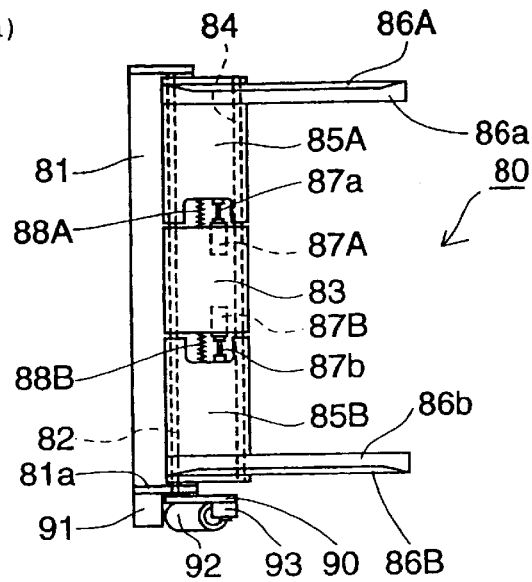
FIG. 4(a)
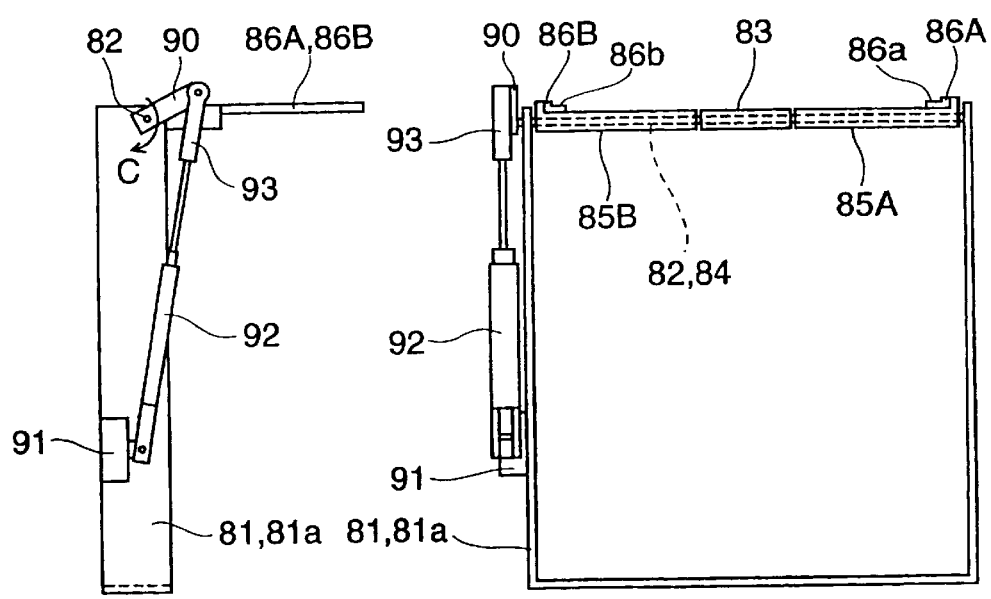
FIG. 4(b)
FIG. 4(c)

FIG. 5(a)
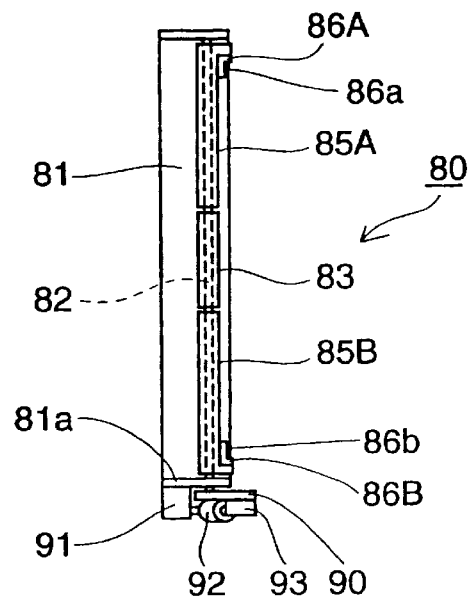
FIG. 5(b)
FIG. 5(c)
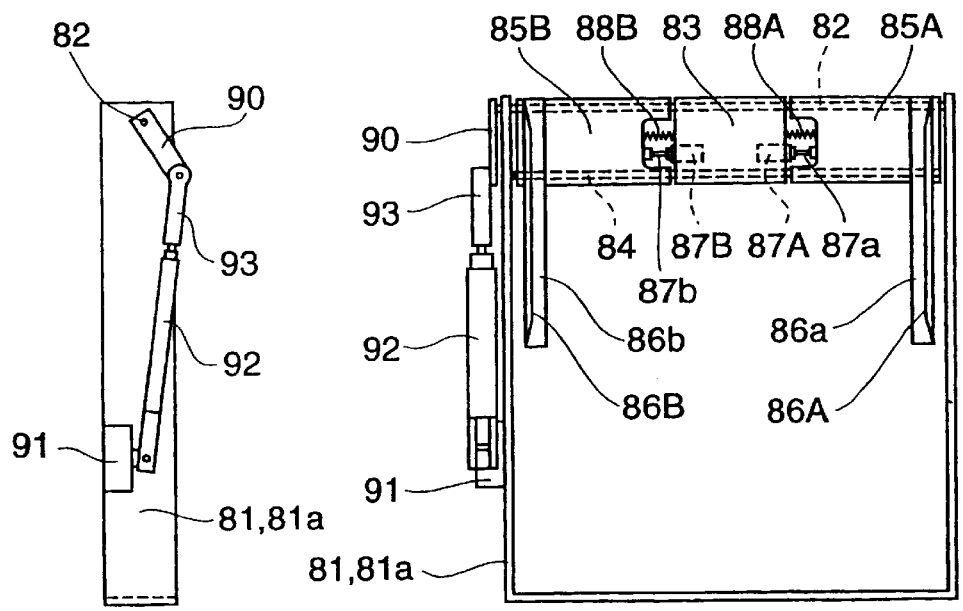

WAFER RING FEEDING APPARATUS

BACKGROUND OF THE INVENTION

1. Field of the Invention

The present invention relates to a wafer ring feeding apparatus.

2. Prior Art

One example of a conventional wafer ring feeding apparatus is described in Japanese Patent Application Laid-Open (Kokai) No. S62-106642.

This feeding apparatus comprises a wafer ring cassette which stores wafer rings at a fixed pitch in a vertical direction, an elevator device which raises and lowers the wafer ring cassette, a wafer ring conveying means which conveys out wafer rings from the wafer ring cassette one at a time to a pellet pick-up device and then returns a used wafer ring to an empty storing section of the wafer ring cassette after the semiconductor pellets are picked up from the wafer ring, and a pair of guide rails which guide both side edge portions of the wafer ring conveyed by the wafer ring conveying means. Typically, a wafer sheet is attached at its outer circumferential portion to the wafer ring, and semiconductor pellets are lined up in the X and Y directions and pasted to the wafer sheet.

The distance between the guide rails in this prior art is adjustable so as to match the width of the guided surfaces on both sides of each one of the wafer rings, and each wafer ring is stored in the wafer ring cassette so that the guide surfaces of the wafer ring are positioned inside the storing section of the wafer ring cassette. However, there may be cases where wafer rings are slightly rotated inside the wafer ring cassette and that where wafer ring is slightly offset toward one side of the wafer ring cassette. When such rotated or offset wafer rings are conveyed, they may become caught on the guide rails or the positioning sections of the wafer rings may not enter positioning pins provided on the jig holder of the pellet pick-up device.

SUMMARY OF THE INVENTION

Accordingly, the object of the present invention is to provide a wafer ring feeding apparatus that can feed wafer rings without being caught on the guide rails and that can convey the wafer rings so as to be positioned at a prescribed position on the jig holder of a pellet pick-up device.

The object of the present invention is accomplished by a unique structure for a wafer ring feeding apparatus which comprises: a wafer ring cassette for storing at a fixed pitch wafer rings to which wafer sheets that have pellets thereon are fastened by tacky adhesion, an elevator device for raising and lowering the wafer ring cassette, a wafer ring conveying means for conveying wafer rings stored in the wafer ring cassette one at a time to a pellet pick-up device, and a pair of guide rails for guiding both side edge portions of the wafer rings conveyed by the wafer ring conveying means; and the wafer ring feeding apparatus further comprises a correcting means that moves the pair of guide rails in the closing direction so as to correct the rotational orientation and/or offset of the wafer ring which is fed out on the guide rails from the wafer ring cassette.

BRIEF DESCRIPTION OF THE DRAWINGS

FIG. 3 illustrates the upper claw and lower claw for clamping the wafer ring, in which

FIG. 4 shows the wafer ring guide means with the guide rails set horizontally; in which FIG. 4(a) is a top view, FIG. 4(b) is a front view, and FIG. 4(c) is a right-side view;

FIG. 5 shows the wafer ring guide means with the guide rails set vertically; in which FIG. 5(a) is a top view, FIG. 5(b) is a front view, and FIG. 5(c) is a right-side view.

DETAILED DESCRIPTION OF THE INVENTION

Figure 1:
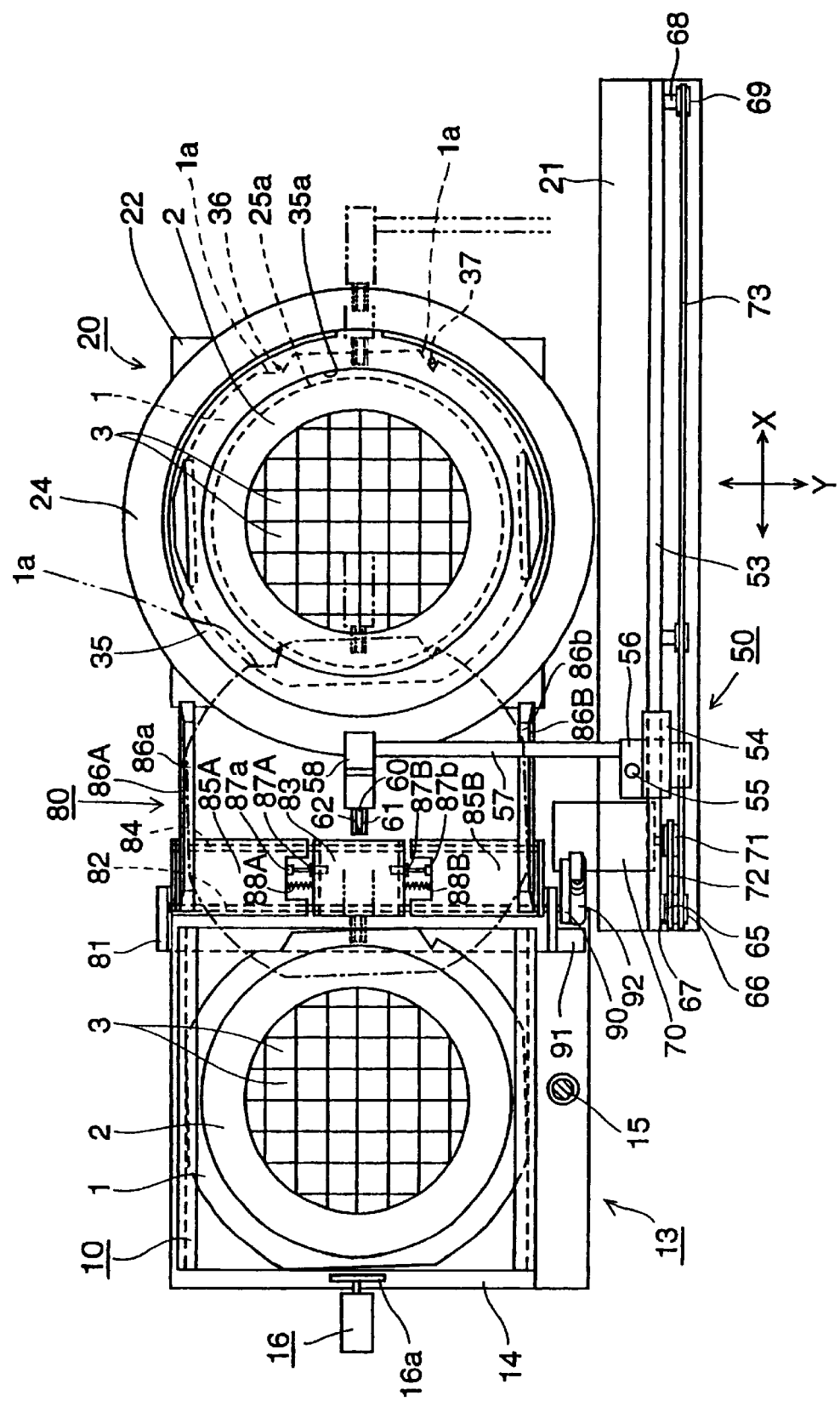
FIG. 1 is a top view of one embodiment of the wafer ring feeding apparatus according to the present invention.

One embodiment of the present invention will be described with reference to FIGS. 1 and 2.

A wafer ring guide means 80 is installed between a wafer ring cassette 10, which is raised and lowered by an elevator device 13, and a pellet pick-up device 20; and the wafer ring guide means 80 includes a pair of guide rails 86A and 86B. These guide rails 86A and 86B guide a wafer ring 1, which is held by an upper claw 60 and lower claw 61 of a wafer ring conveying means 50, from the wafer ring cassette 10 to the pellet pick-up device 20 and also from the pellet pick-up device 20 to the wafer ring cassette 10. In addition, the guide rails 86A and 86B are opened and closed (or moved closer to or away from each other) by a correcting means or an open-and-close mechanism.

Thus, a wafer ring 1 is conveyed from the wafer ring cassette 10, the guide rails 86A and 86B are closed (or the space between them is narrowed) by the open-and-close mechanism so that the rotational orientation and/or offset of the wafer ring 1 are corrected by the closing motion of the guide rails. Typically, the guide rails 86A and 86B are provided in a slidable fashion on a slide shaft 82 and respectively urged in the closing direction by springs 88A and 88B and are moved, overcoming the spring force of the springs 88A and 88B, in the opening direction by a driving means such as air cylinders 87A and 87B, etc., thus changing (open and close) the space in between.

One embodiment of the present invention will be described below in more detail with reference to FIGS. 1 through 5.

Figure 2:
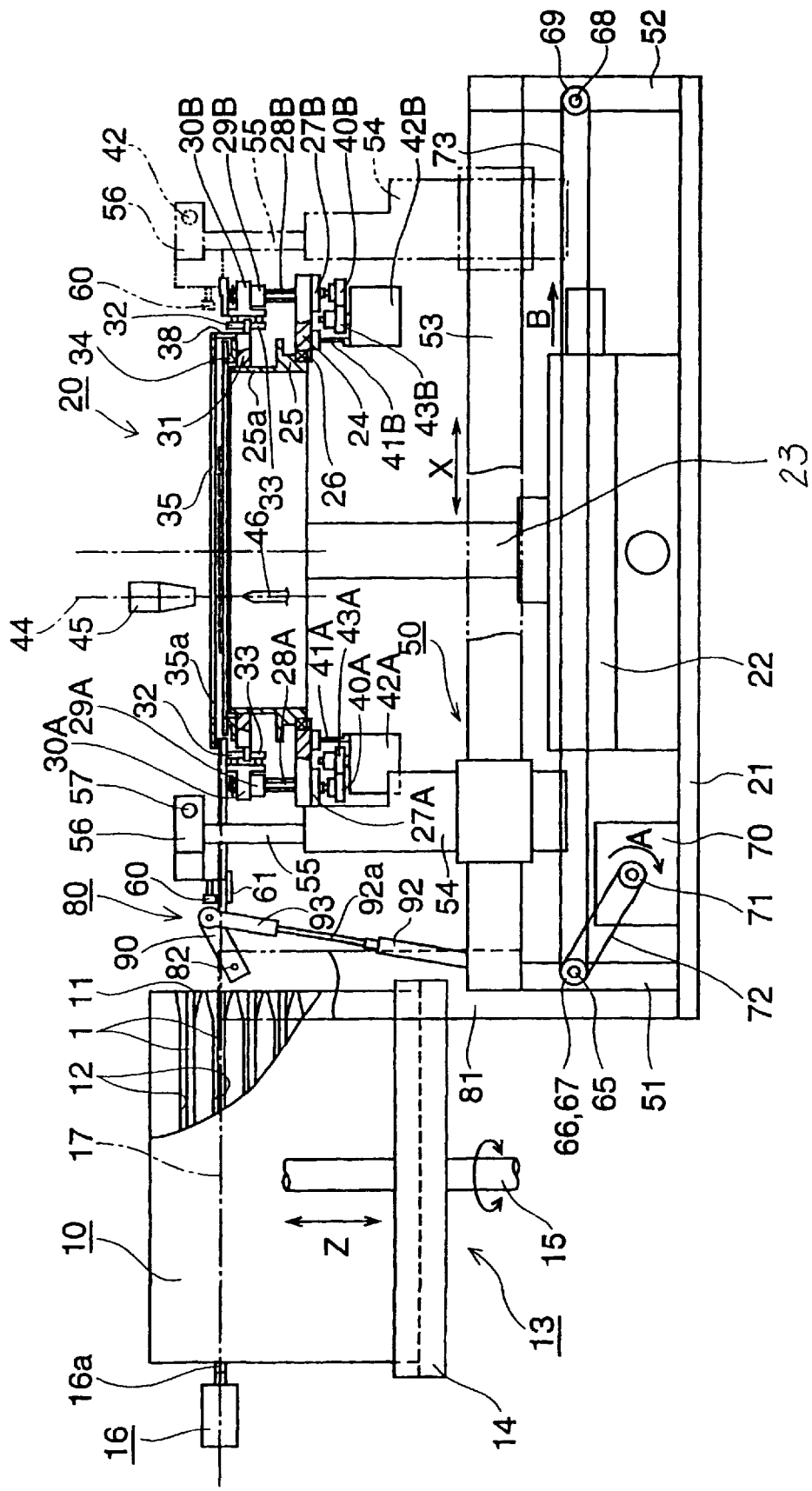
FIG. 2 is a partially sectional front view thereof.

As shown in FIGS. 1 and 2, the outer circumferential portion of a wafer sheet 2 is attached to a wafer ring 1, and semiconductor pellets 3 formed by cutting a wafer in the longitudinal and lateral directions are lined up in the X and Y directions and pasted to the wafer sheet 2. The wafer ring feeding apparatus of this embodiment includes: a wafer ring cassette 10 which stores wafer rings 1 therein, an elevator device 13 which raises and lowers the wafer ring cassette 10, a pusher 16 which pushes out a wafer ring 1 from the wafer ring cassette 10, a pellet pick-up device 20 which is installed at a predetermined distance from the wafer ring cassette 10 next to the wafer ring cassette 10 so as to be near the opening 11 thereof, a wafer ring conveying means 50 which conveys unused wafer rings 1 stored in the wafer ring cassette 10 one at a time to the pellet pick-up device 20 and then returns used wafer rings 1 into the wafer ring cassette 10 after the semiconductor pellets 3 have been picked-up from the pellet, and a wafer ring guide means 80 which guides the wafer rings 1 when the wafer rings 1 are conveyed by the wafer ring conveying means 50.

First, the structures of the wafer ring cassette 10, elevator device 13 and pusher 16 will be described. Since they have conventionally well known structures, the description will be given briefly.

The wafer ring cassette 10 has a plurality of wafer ring storing sections 12 which are positioned at a prescribed pitch in the vertical direction (Z direction), and a wafer ring 1 is stored in each wafer ring storing section 12. The elevator device 13 includes an elevator 14 which positions and carries the wafer ring cassette 10. The elevator 14 is engaged with a screw shaft 15 which is rotated by a motor (not shown). The pusher 16 is typically an air cylinder and is installed at the wafer ring conveying level 17 so as to push out, by a pusher rod 16a thereof, a wafer ring 1 (stored inside the wafer ring cassette 10) through the opening 11 of the cassette 10.

Next, the pellet pick-up device 20 will be described.

The pellet pick-up device 20 includes an XY table 22. The XY table 22 is installed on a base plate 21 and driven in the X and Y directions; and a stand 23 is provided on the XY table 22. A circular supporting plate 24 is fastened to the stand 23, and a wafer sheet fastening ring 25 is supported on the supporting plate 24 via a bearing 26. Here, the wafer sheet fastening ring 25 has a cylindrical section 25a that has an external diameter smaller than the internal diameter of the wafer rings 1. The wafer sheet fastening ring 25 is rotated by a driving means (not shown) so that the angular orientation of the pellets 3 can be corrected.

Furthermore, bearings 27A and 27B are fastened to the supporting plate 24 at symmetrical positions with respect to the center of the wafer sheet fastening ring 25. Externally threaded screw shafts 28A and 28B are rotatably supported on the bearings 27A and 27B; and internally threaded screws 29A and 29B are engaged with the externally threaded screw shafts 28A and 28B. The internally threaded screws 29A and 29B are fastened to ring holder raising-and-lowering members 30A and 30B. Rollers 32 and 33 are rotatably supported on the ring holder raising-and-lowering members 30A and 30B so that the peripheral portions of a wafer sheet stretching ring holder 31 are clamped from above and below.

A wafer ring holding plate 34 and a wafer sheet stretching ring 35 are fastened to the wafer sheet stretching ring holder 31. The wafer ring holding plate 34 temporarily holds the wafer ring 1, and the wafer sheet stretching ring 35 positioned above the wafer ring holding plate 34 has a gap between the wafer sheet stretching ring 35 and the wafer ring holding plate 34. The right-side portion of the wafer sheet stretching ring 35 with respect to FIG. 2 is fastened to the wafer sheet stretching ring holder 31 via a crescent-shaped connecting plate 38 so that a gap of a fixed width is maintained between these two elements. The wafer sheet stretching ring 35 is sized so that the internal-diameter portion 35a thereof can spacedly fit over the cylindrical section 25a of the wafer sheet fastening ring 25. In addition, positioning pins 36 and 37 (see FIG. 1) which position the pin positioning section 1a of the wafer ring 1 are provided on the wafer ring holding plate 34.

Gears 40A and 40B are fastened to the portions of the externally threaded shafts 28A and 28B that protrude downward from the supporting plate 24; and first and second motors 42A and 42B are mounted to the supporting plate 24 via motor supporting plates 41A and 41B, and gears 43A and 43B which are fastened to the output shafts of the first and second motors 42A and 42B are coupled to the gears 40A and 40B.

A vacuum suction nozzle 45 which is movable in the Z direction and in the X and Y directions by a raising-and-lowering means and an XY table (not shown) is installed above the pick-up position 44, and a needle 46 which is movable in the Z direction by a raising-and-lowering means (not shown) is installed beneath the pick-up position 44.

Next, the structure of the wafer ring conveying means 50 will be described.

Supporting frames 51 and 52 are mounted on the base plate 21, and a guide rail 53 which extends in the X direction is secured to the upper end portions of the supporting frames 51 and 52. A slider 54 is slidably fitted on the guide rail 53, and a supporting rod 55 which extends vertically is fastened to the slider 54. A supporting block 56 is fastened to the upper end of the supporting rod 55, and an arm 57 which extends in the Y direction (see FIG. 1) is fastened to this supporting block 56.

Figure 3A:
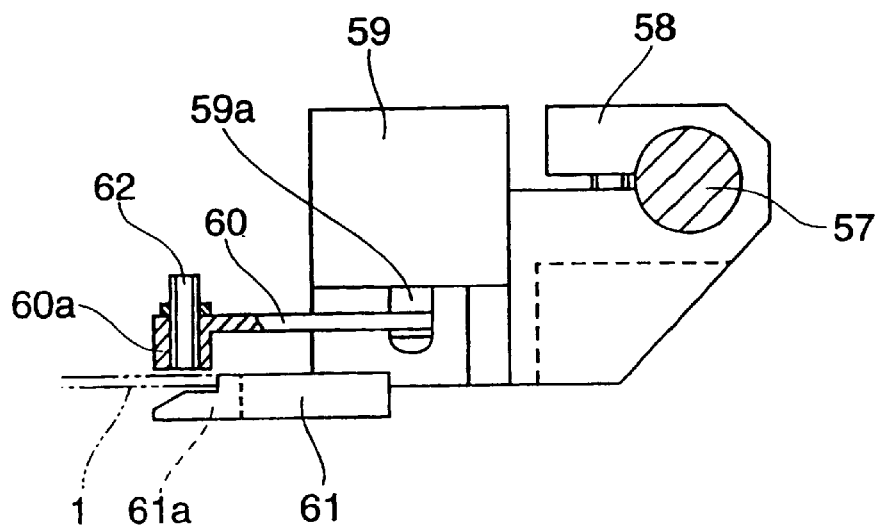
FIG. 3(a) is a partially sectional front view.
Figure 3B:
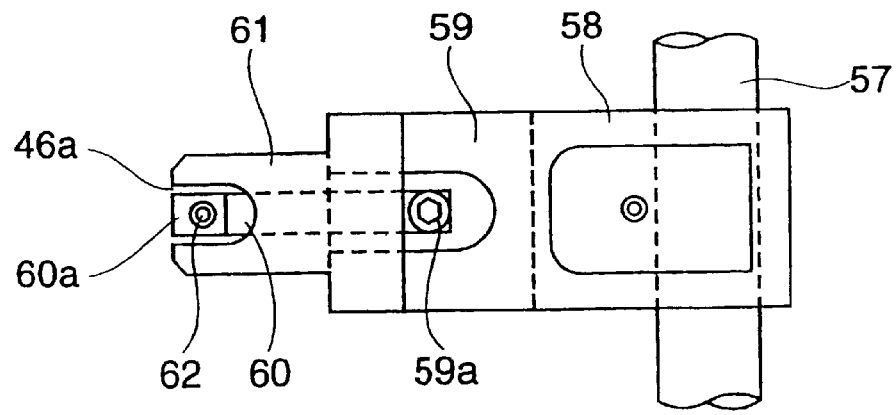
FIG. 3(b) is a bottom view.

A claw holder 58 is, as seen from FIGS. 3(a) and 3(b), fastened to the tip end portion of the arm 57, and an air cylinder 59 is fastened to this claw holder 58 as shown in FIG. 3. An upper claw 60 that has a wafer ring holder 60a is coupled to the operating rod 59a of this air cylinder 59, and a lower claw 61 is fastened to the claw holder 58 so as to face the upper claw from below. The upper claw 60 has a fiber sensor 62 provided on the wafer ring holder 60a, and the lower claw 61 is formed with a groove 61a so as to face the wafer ring holder 60a.

A pulley shaft 65 is, as shown in FIG. 2, rotatably supported on the supporting frame 51 beneath the guide rail 53, and two pulleys 66 and 67 are provided on this pulley shaft 65. In addition, a pulley shaft 68 is rotatably supported on the supporting frame 52 at a position that corresponds to the pulley shaft 66, and a pulley 69 is provided on this pulley shaft 68. A motor 70 is mounted on the base plate 21, and a pulley 71 is coupled to the output shaft of this motor 70. Furthermore, a drive belt 72 is installed between the pulleys 67 and 71, and a conveyor belt 73 is installed between the pulleys 66 and 69. The upper portion of the conveyor belt 73 is connected to the slider 54.

The structure of the wafer ring guide means 80 will be described with reference to FIGS. 1 through 5 and especially with reference to FIGS. 4 and 5.

A frame body 81 is erected on the base plate 21 so as to be between the wafer ring cassette 10 and the pellet pick-up device 20. A slide shaft 82 which extends in the Y direction at a level slightly below the wafer ring conveying level 17 is rotatably supported on the upper end portion of the frame body 81, and a guide rail driver supporting plate 83 is fastened to the central portion of this slide shaft 82. In addition, a guide rod 84 is fastened to the guide rail driver supporting plate 83 so as to be parallel to the slide shaft 82, and a pair of guide rail supporting plates 85A and 85B are fitted over the slide shaft 82 and guide rod 84.

The guide rail supporting plates 85A and 85B are positioned on both sides of the guide rail driver supporting plate 83 so as to be slidable on the slide shaft 82 and guide rod 84 in the Y direction. A pair of guide rails 86A and 86B which guide both side edge portions of the wafer ring 1 are fastened to the guide rail supporting plates 85A and 85B. Here, when the guide rails 86A and 86B are in a horizontal position (as described later), the conveying surfaces 86a and 86b of the guide rails 86A and 86B are positioned on the wafer ring conveying level 17.

Furthermore, air cylinders 87A and 87B are mounted on the guide rail driver supporting plate 83 so as to face the guide rail supporting plates 85A and 85B. In addition, springs 88A and 88B are provided between the guide rail driver supporting plate 83 and the guide rail supporting plates 85A and 85B, and the guide rail supporting plates 85A and 85B contact the operating rods 87a and 87b of the air cylinders 87A and 87B.

As best seen from FIG. 4(a), a crank lever 90 is fastened to a portion of the slide shaft 82 which protrudes from a side plate 81a. An air cylinder supporting block 91 is mounted to the lower portion of the side plate 81a, and an air cylinder 92 is provided on this air cylinder supporting block 91 in a pivotable fashion. A connecter 93 is, at its one end, coupled to the operating rod 92a (see FIG. 2) of the air cylinder 92 and, at its another end, rotatably linked to the crank lever 90.

Next, the operation of the apparatus described above will be described.

When the screw shaft 15 of the elevator device 13 is rotated, the elevator 14 and wafer ring cassette 10 are moved upward or downward, so that a corresponding wafer ring storing section 12 of the wafer ring cassette 10 is positioned on the wafer ring conveying level 17. At this time, the guide rails 86A and 86B of the wafer ring guide means 80 are in a horizontal position (FIG. 4). Furthermore, the operating rods 87a and 87b of the air cylinders 87A and 87B of the wafer ring guide means 80 are in a protruded position so that the width between the conveying surfaces 86a and 86b of the guide rails 86A and 86B (see FIG. 4(a)) is slightly wider than the width of the storing section 12 of the wafer ring cassette 10.

Next, with the upper claw 60 in an open state (or separated from the lower claw 61), the slider 54 of the wafer ring conveying means 50 is positioned near the wafer ring cassette 10, and the upper claw 60 is positioned above the guide rail driver supporting plate 83 as indicated by the two-dot chain line on the left side of FIG. 1.

Then, the pusher 16 is actuated so that the pusher rod 16a of the pusher advances (towards the right in FIGS. 1 and 2), thus pushing a wafer ring 1 out of the wafer ring cassette 10 so that the wafer ring 1 is fed between the upper claw 60 and lower claw 61. As a result, light from the fiber sensor 62 is reflected by the wafer ring 1, and the fiber sensor 62 detects this reflected light and outputs an "on" signal.

The air cylinder 59 is actuated by this "on" signal so that the operating rod 59a is lowered (see FIG. 3(a)), thus causing the upper claw 60 to be lowered and the end portion of the wafer ring 1 is held between the upper and lower claws 60 and 61.

Next, the motor 70 is activated in the forward direction as indicated by arrow A in FIG. 1, so that the conveyor belt 72 is rotated in the direction of arrow B (i.e., toward the right in FIG. 1) by the rotation of the pulley 71, thus causing the slider 54 to move in the same direction (B) along the guide rail 53. As a result, the wafer ring 1, held by the upper and lower claws 60 and 61, is guided by the pair of guide rails 86A and 86B of the wafer ring guide means 80 and conveyed onto the guide rails 86A and 86B as indicated by the two-dot chain line, whereupon the motor 70 is stopped.

Next, the operating rod 59a of the air cylinder 59 is raised so that the upper claw 60 is opened (or separated from the lower claw 61), thus releasing the wafer ring 1 which is on the guide rails 86A and 86B.

Then, the air cylinders 87A and 87B of the wafer ring guide means 80 are actuated so as to retract the operating rods 87a and 87b. As a result, the guide rail supporting plates 85A and 85B and therefore the guide rails 86A and 86B are moved toward the center (or toward each other) along the slide shaft 82 and guide rod 84 by the driving force of the springs 88A and 88B. As a result, any rotational deviation or offset of the wafer ring 1 on the guide rails 86A and 86B is corrected.

Then, the air cylinder 59 is again actuated so that the operating rod 59a is lowered, thus causing the wafer ring 1 to be held between the upper and lower claws 60 and 61.

Afterward, the operating rods 87a and 87b of the air cylinders 87A and 87B are extended so that the guide rails 86A and 86B are moved in the opposite direction so as to separate from each other. Thus, the guide rails 86A and 86B are opened. At the same time, the motor 70 is rotated in the forward direction as indicated by arrow A, so that the wafer ring 1 is conveyed into the space between the wafer ring holding plate 34 and wafer sheet stretching ring 35 of the pellet pick-up device 20 and then positioned by the positioning pins 36 and 37, whereupon the rotation of the motor 70 is stopped.

Next, the operating rod 59a of the air cylinder 59 is retracted, so that the wafer ring 1 is released from the upper and lower claws 60 and 61.

Then, the motor 70 is again activated in the forward direction so as to move the slider 54 toward the right, thus positioning the upper and lower claws 60 and 61 provided on the slider 54 on the right side of the wafer ring holding plate 34 (as indicated by the two-dot chain line in FIG. 1). Thus, the wafer ring 1 is positioned on the wafer ring holding plate 34.

When the wafer ring 1 is moved onto the wafer ring holding plate 34 as described above, the air cylinder 92 of the wafer ring guide means 80 is actuated so as to retract the operating rod 92a. As a result, the crank lever 90 and slide shaft 82 are rotated in the direction of arrow C indicated in FIG. 4, particularly in FIG. 4(b), so that the guide rails 86A and 86B are pivoted in the same direction. As a result, the guide rails 86A and 86B are brought into a vertical position as shown in FIG. 5, particularly seen from FIG. 5(b).

When the wafer ring 1 is placed on the wafer ring holding plate 34 as described before, the first and second motors 42A and 42B are actuated in synchronization, so that the screw shafts 28A and 28B are both rotated via the gears 43A and 43B and gears 40A and 40B. As a result, the screws 29A and 29B, ring holder raising-and-lowering members 30A and 30B, rollers 32 and 33, wafer sheet stretching ring holder 31 and wafer sheet stretching ring 35 are lowered.

When the wafer sheet stretching ring holder 31 is thus lowered, the wafer sheet 2 is placed on the cylindrical section 25a of the wafer sheet fastening ring 25.

When the wafer sheet stretching ring holder 31 is lowered further, the wafer ring holding plate 34 is positioned below the upper surface 25b of the cylindrical section 25a of the wafer sheet fastening ring 25, so that the wafer ring 1 on the wafer ring holding plate 34 is placed on the upper surface 25b of the cylindrical section 25a of the wafer sheet fastening ring 25.

Afterward, the wafer sheet stretching ring 35 is fitted loosely over the cylindrical section 25a of the wafer sheet fastening ring 25 while pressing the wafer ring 1 downward. As a result, the wafer sheet 2 is stretched, and the gaps between the pellets 3 are widened.

The XY table 22 is next driven so that a semiconductor pellet 3 that is to be picked up is positioned in the pick-up position 44; and the needle 46 is raised so as to push up the semiconductor pellet 3, and the vacuum suction nozzle 45 is lowered. As a result, the semiconductor pellet 3 positioned in the pick-up position 44 is picked up by this vacuum suction.

The vacuum suction nozzle 45 that holds the semiconductor pellet 3 by vacuum suction is moved up, in the X and Y directions and then lowered, so that the semiconductor pellet 3 is placed on a semiconductor pellet positioning section or in a bonding position (not shown). The, the vacuum suction nozzle 45 is moved once again to the pick-up position 44.

When a semiconductor pellet 3 positioned in the pick-up position 44 is picked up, the XY table 22 is driven so that the next semiconductor pellet 3 to be picked up is positioned in the pick-up position 44; and the semiconductor pellets 3 are thus successively picked up by the vacuum suction nozzle 45.

When all the semiconductor pellets 3 on the wafer sheet 2 have been picked up, the wafer ring 1 is returned to the wafer ring cassette 10 as a used wafer ring. The used wafer rings 1 are returned in the following manner:

The XY table 22 is driven so that the pellet pick-up device 20 is moved to its initial position (i.e., the position where a wafer ring 1 is supplied). The first and second motors 42A and 42B are rotated in the reverse direction so that the wafer sheet stretching ring holder 31 and wafer sheet stretching ring 35 are raised and lift the wafer ring 1 from the wafer ring holding plate 34.

Next, the air cylinder 92 is actuated so as to extend the operating rod 92a, thus causing the crank lever 90 and slide shaft 82 to rotate in the direction opposite from the direction C. As a result, the guide rails 86A and 86B are brought into a horizontal position as shown in FIG. 4 (FIG. 4(b)). In addition, with the upper and lower claws 60 and 61 being kept opened, the motor 70 is actuated so that the upper and lower claws 60 and 61 are moved toward the left in FIG. 1, so that the end portion of the used wafer ring 1 is positioned between the upper claw 60 and lower claw 61. In this case, the presence or absence of the used wafer ring 1 between the upper and lower claws 60 and 61 is detected by the fiber sensor 62. Then, the air cylinder 59 is actuated so that the operating rod 59a is lowered, thus causing the wafer ring 1 to be held between the upper and lower claws 60 and 61.

Next, the motor 70 is actuated so as to move the slider 54 toward the left in FIG. 1. As a result, the used wafer ring 1 held by the upper and lower claws 60 and 61, being guided by the guide rails 86A and 86B, is conveyed back into an empty storing section 12 of the wafer ring cassette 10.

Afterward, the air cylinder 59 is actuated so as to retract the operating rod 59a, thus releasing the used wafer ring 1 from the upper and lower claws 60 and 61. The used wafer ring 1 is thus stored in the storing section 12 of the wafer ring cassette 10.

When the supplying and returning of one wafer ring 1 is thus completed, the wafer ring cassette 10 is lowered one pitch by the lowering action of the elevator 14 of the elevator device 13, and the next unused wafer ring 1 that is to be pushed out is positioned at the wafer ring conveying level 17 so that this wafer ring 1 is processed by the series of operations described above.

As seen from the above, the guide rails 86A and 86B are opened and closed (or moved closer to and away from each other) by the air cylinders 87A and 87B. Accordingly, by setting the width between the conveying surfaces 86a and 86b of the guide rails 86A and 86B to be slightly greater than the width of the storing section 12 of the wafer ring cassette 10, the wafer rings 1 are not caught on the guide rails 86A and 86B when pushed out onto the guide rails 86A and 86B. Furthermore, after the wafer rings 1 have been pushed out onto the guide rails 86A and 86B from the wafer ring cassette 10, the guide rails 86A and 86B are moved so as to get closer to each other by the air cylinders 87A and 87B. As a result, the rotational orientation and/or offset of the wafer ring 1 is corrected by this motion of the guide rails 86A and 86B, so that the wafer ring 1 can be conveyed and then positioned in a prescribed position in the pellet pick-up device 20 (i.e., in a position determined by the positioning pins 36 and 37) without any positional deviation.

In the embodiment described above, the open-and-close operation of the guide rails 86A and 86B is executed by the air cylinders 87A and 87B and by springs 88A and 88B. However, the present invention is not limited to this arrangement. For example, it is also possible to use a mechanism in which racks are formed on the guide rails 86A and 86B, a pinion which engages with these racks is rotatably provided on the guide rail driver supporting plate 83, and this pinion is rotated by a motor mounted on the guide rail driver supporting plate 83.

In the above embodiment, furthermore, the guide rails 86A and 86B are pivotable; however, it goes without saying that the present invention can be used to a system that includes non-pivotal guide rails (as disclosed in Japanese Patent Application Laid-Open (Kokai) No. 62-106642).

As seen from the above, according to the present invention, an open-and-close mechanism moves a pair of guide rails in the closing direction when a wafer ring is fed out onto the guide rails from the wafer ring cassette, so that the rotational orientation and/or offset of the wafer ring are corrected by such a movement of the closing direction. Accordingly, the wafer rings are not caught by the guide rails, and the wafer ring can be conveyed and positioned at a predetermined position on the jig holder of the pellet pick-up device.

We claim:

1. A wafer ring feeding apparatus comprising a wafer ring cassette that stores wafer rings to which wafer sheets on which pellets are pasted are fastened by tacky adhesion, an elevator device that raises and lowers said wafer ring cassette, a wafer ring conveying means that conveys wafer rings stored in said wafer ring cassette one at a time to a pellet pick-up device, a pair of guide rails that guide said wafer rings at opposite edge portions of said wafer rings while being conveyed by said wafer ring conveying means, and an open-and-close mechanism which causes said pair of guide rails to open to a width between said pair of guide rails slightly wider than a width of said wafer ring before the wafer ring is supplied to said pair of guide rails and to move in a closing direction after a wafer ring is supplied to said guide rails from said wafer ring cassette for correcting rotational orientation and offset of said wafer ring, whereby the wafer ring can be conveyed and positioned at a predetermined position of said pellet pick-up device.

2. A wafer ring feeding apparatus according to claim 1, wherein said open-and-close mechanism comprises a slide shaft installed in a horizontal direction perpendicular to a conveying direction of said wafer rings so that said guide rails are installed thereon in a slidable fashion, a spring means which urges said pair of guide rails in said closing direction, and guide rail driving means which causes said pair of guide rails to move in an opening direction overcoming a driving force of said spring means.

* * * * *